United States Patent

St. Amand et al.

[11] Patent Number: 6,087,241
[45] Date of Patent: Jul. 11, 2000

[54] METHOD OF FORMING SIDE DIELECTRICALLY ISOLATED SEMICONDUCTOR DEVICES AND MOS SEMICONDUCTOR DEVICES FABRICATED BY THIS METHOD

[75] Inventors: Roger St. Amand, Tempe; Robert Ma, Phoenix; Neil Deutscher, Tempe, all of Ariz.

[73] Assignee: Microchip Technology Incorporated, Chandler, Ariz.

[21] Appl. No.: 09/066,120

[22] Filed: Apr. 24, 1998

Related U.S. Application Data

[63] Continuation-in-part of application No. 08/924,861, Sep. 5, 1997, Pat. No. 5,956,589.

[51] Int. Cl.$^7$ ................................................. H01L 21/76
[52] U.S. Cl. ............................................ 438/400; 438/439
[58] Field of Search ..................................... 438/400, 439, 438/945; 257/506, 509

[56] References Cited

U.S. PATENT DOCUMENTS

| | | |
|---|---|---|
| 4,630,356 | 12/1986 | Christie et al. ........................... 29/576 |
| 5,236,862 | 8/1993 | Pfiester et al. . |
| 5,358,892 | 10/1994 | Rolfson . |
| 5,399,520 | 3/1995 | Jang . |
| 5,683,933 | 11/1997 | Seino . |
| 5,707,889 | 1/1998 | Hsu et al. . |

FOREIGN PATENT DOCUMENTS 0 424 011   4/1991   European Pat. Off. .

OTHER PUBLICATIONS

PCT International Search Report dated Aug. 31, 1999.

*Primary Examiner*—Caridad Everhart
*Attorney, Agent, or Firm*—Paul N. Katz; Ronald L. Chichester; Frohwitter

[57] ABSTRACT

A method is disclosed for forming narrow thermal silicon dioxide side isolation regions in a semiconductor substrate and MOS or CMOS semiconductor devices fabricated by this method. A thin stress relief layer is used in conjunction with a polysilicon buffering stress relief layer on the surface of a semiconductor substrate prior to the field oxidation process to restrict lateral silicon dioxide expansion thereby permitting the creation of narrow thermal silicon dioxide side isolation regions in the semiconductor substrate. A silicon dioxide layer is also used between an amorphous polysilicon (buffering stress relief) layer and a silicon nitride layer to function as an oxide cap, to avoid undesired pitting of the amorphous polysilicon layer, and to avoid interaction between the silicon nitride and amorphous polysilicon layers in areas of high stress.

12 Claims, 5 Drawing Sheets

METHOD OF FORMING SIDE DIELECTRICALLY ISOLATED SEMICONDUCTOR DEVICES AND MOS SEMICONDUCTOR DEVICES FABRICATED BY THIS METHOD

RELATED APPLICATION

This application is a continuation-In-Part of a U.S. patent application filed in the names of the applicants of this patent application which is entitled "METHOD OF FORMING NARROW THERMAL SILICON DIOXIDE SIDE ISOLATION REGIONS IN A SEMICONDUCTOR SUBSTRATE AND MOS SEMICONDUCTOR DEVICES FABRICATED BY THIS METHOD", Ser. No. 08/924,861, filed Sep. 5, 1997, now U.S. Pat. No. 5,956,589 and assigned to the same assignee of this patent application.

FIELD OF THE INVENTION

This invention relates generally to methods of making semiconductor devices and devices produced from these methods and, more particularly, to methods of forming dielectrically isolated (silicon dioxide) side isolation regions in a semiconductor substrate and MOS semiconductor devices fabricated by this method.

BACKGROUND OF THE PRIOR ART

In the past, (integrated) semiconductor devices fabricated in semiconductor substrates were generally isolated from each other in the same semiconductor substrate by some form of electrical isolation much as by PN junction isolation or by dielectric isolation.

Dielectric isolation as a means of electrically isolating semiconductor devices in one semiconductor substrate is generally preferred by semiconductor manufacturers because of the avoidance of junction breakdown that can occur when using PN junction isolation. Furthermore, because of lateral diffusion that occurs during various heat treatment operations, the use of PN junction isolated regions was not very desirable since increases in the lateral width of PN junction isolated regions resulted in reduction in device density for each semiconductor chip. Silicon real estate is very important in reducing costs and the loss of silicon real estate because of laterally expanding PN junction isolated regions was very undesirable.

Consequently, the preference of semiconductor manufacturers and especially integrated circuit manufacturers is to use dielectric isolation especially for sidewall isolation in manufacturing integrated circuit devices such as Complementary MOS (CMOS) devices. The most significant advantage of the use of sidewall dielectric isolation regions is the fact that they provide much better electrical isolation between devices such as for MOS or Complementary MOS devices.

However, in order to obtain maximum device (MOS or CMOS) density in one semiconductor chip, it is extremely important to find a way of how to restrict or limit the width of the sidewall dielectric isolation regions. Narrow width sidewall dielectric isolation regions will permit increased device (MOS or CMOS) densification and a resulting increase in the number of circuits that can be fabricated in each semiconductor chip. Therefore, increased device densification means a greater utilization of silicon real estate and a corresponding reduction in manufacturing costs because more MOS and/or CMOS devices can be fabricated in each semiconductor chip.

The above identified co-pending patent application provides a solution to producing narrow width sidewall dielectric isolation regions for the manufacture of integrated semiconductor devices and circuits, however, in carrying out the earlier dielectric sidewall isolation method, it was discovered that further changes in prior processes could provide significant improvements in both definition and yield.

Accordingly, a need existed for an improved method or process of forming narrow thermal silicon dioxide side isolation regions in a semiconductor substrate and MOS (or CMOS) semiconductor devices fabricated by this method or process.

SUMMARY OF THE INVENTION

It is an object of this invention to provide an improved semiconductor method of fabricating integrated circuits and to provide integrated semiconductor devices manufactured by this method.

It is a further object of this invention to provide an improved semiconductor method of fabricating sidewall dielectric isolated semiconductor devices and to provide sidewall isolated semiconductor devices manufactured by this method.

It is a still further object of this invention to provide an improved semiconductor method of fabricating narrow sidewall dielectric isolated semiconductor devices and to provide narrow sidewall dielectric isolated semiconductor devices manufactured by this method.

It is still another object of this invention to provide an improved semiconductor method of fabricating narrow sidewall dielectric isolated semiconductor devices such as MOS and CMOS devices and to provide narrow sidewall dielectric isolated semiconductor devices such as MOS and CMOS devices manufactured by this method.

BRIEF DESCRIPTION OF THE PREFERRED EMBODIMENTS

In accordance with one embodiment of this invention, a method of forming narrow thermal silicon dioxide side isolation regions in a semiconductor substrate is disclosed comprising the steps of providing a semiconductor substrate: forming an oxide oxynitride stress relief layer on a surface of the semiconductor substrate; depositing a preferably amorphous polysilicon layer on a surface of the oxynitride layer; depositing a silicon dioxide layer on a surface of the amorphous polysilicon layer; depositing a silicon nitride layer on a surface of the silicon dioxide layer; forming a patterned photoresist layer with openings therein on a surface of the silicon nitride layer; removing portions of the silicon nitride layer, the silicon dioxide layer and the amorphous polysilicon layer beneath the openings in the patterned photoresist layer; removing the patterned photoresist layer lying on the silicon nitride layer; removing exposed portions of the oxynitride layer exposed after the step of removing portions of the silicon nitride layer, the silicon dioxide layer and the amorphous polysilicon layer using the silicon nitride layer as a mask; thermally growing narrow silicon dioxide sidewall isolation regions into the semiconductor substrate through openings formed in the oxynitride layer; removing remaining portions of the silicon nitride layer, the silicon dioxide layer, the amorphous polysilicon layer and the oxynitride layer located on the semiconductor substrate to leave the semiconductor substrate with a bare surface having the narrow silicon dioxide sidewall isolation regions located in surface portions of the semiconductor substrate; and subsequently forming at least one MOS semiconductor device in the semiconductor substrate between the narrow silicon dioxide sidewall isolation regions formed in the semiconductor substrate.

In accordance with another embodiment of this invention, a MOS semiconductor device is disclosed that is manufactured by the method of this invention.

In accordance with still another embodiment of this invention, a CMOS semiconductor device is disclosed that is manufactured by the method of this invention.

The foregoing and other objects, features and advantages of this invention will be apparent from the following more particular description of the preferred embodiments of the invention as illustrated in the accompanying drawings.

DESCRIPTION OF THE SPECIFICATIONS

Figure 1:
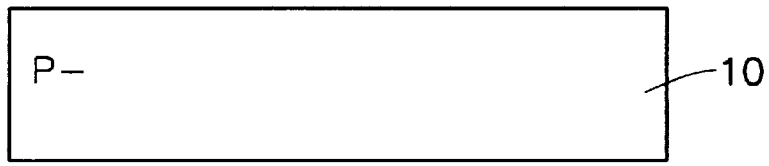
FIGS. 1–15 illustrate a method of fabricating the device according to the mehod of the present invention.

Referring to FIG. 1, reference numeral 10 generally designates a starting semiconductor substrate which, in the illustration shown as an example of carrying out the method of this invention, is a P-type silicon semiconductor substrate (silicon doped with P-type impurities). The thickness of the starting P-type substrate 10 can be varied as desired. If desired, the starting substrate can be an N-type of substrate and therefore the semiconductor regions formed therein starting with FIG. 12 through FIG. 15 will be of the opposite conductivity type from the conductivity types shown in FIGS. 12–15.

Figure 2:
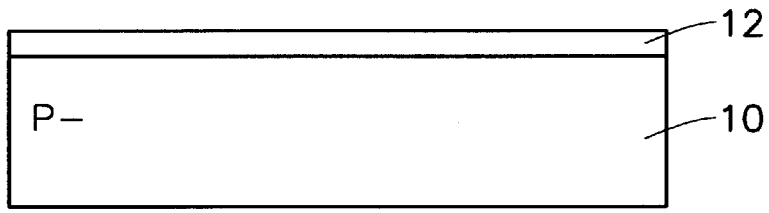

Referring to FIG. 2, a preferably thin layer 12 of oxynitride is grown on a surface of the starting P-semiconductor substrate 10. For example, the thin layer 12 of oxynitride has a thickness of about 100 Angstroms and is, for example, formed using $N_2O$ as the oxidizing agent. The oxynitride layer 12 provides a stress relief and etch stopping function for the semiconductor substrate 10.

Figure 3:
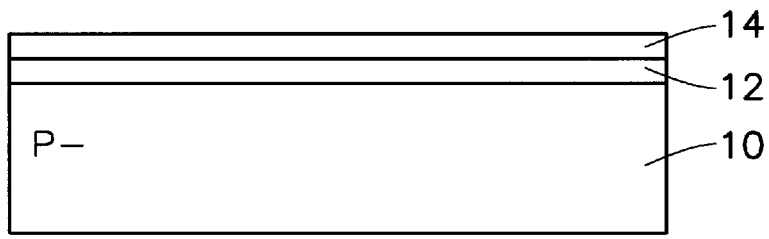

Referring to FIG. 3, a preferably thicker layer 14 of amorphous polysilicon is deposited on the thin layer 12 of oxynitride. For example, the thicker layer 14 of amorphous polysilicon has a thickness of about 400 Angstroms and is deposited, for example, using a CVD (Chemical Vapor Deposition) process. The term amorphous polysilicon is intended to mean that the layer 14 is essentially a polysilicon layer that is not doped with grains having average diameters of less than 300 Angstroms.

Figure 4:
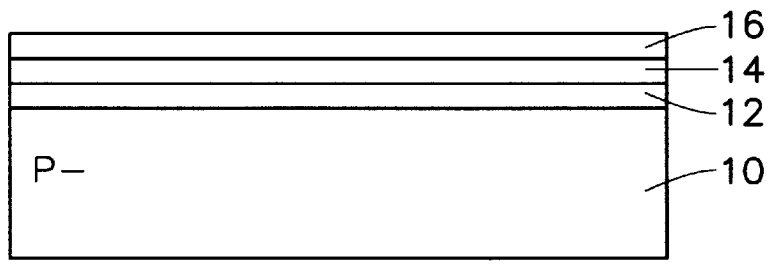

Referring to FIG. 4, a layer 16 of silicon dioxide is deposited on the amorphous polysilicon layer 14. Preferable, the silicon dioxide layer 16 has a thickness of about 100 Angstroms and is deposited, for example, using a CVD process.

Figure 5:
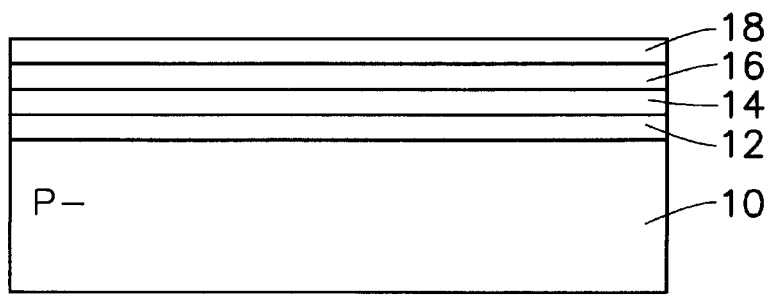

Referring to FIG. 5, a layer 18 of silicon nitride is deposited on the silicon dioxide layer 16. For example, the silicon nitride layer 18 can be deposited by using a CVD process to a thickness, as desired, however, a thickness of at least 1000 Angstroms is preferred.

Figure 6:
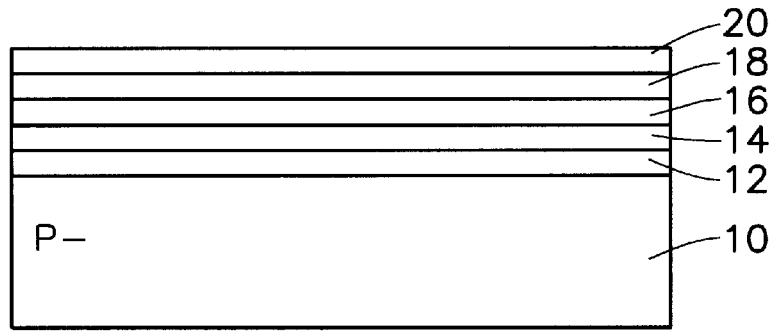

Referring to FIG. 6, a layer 20 of photoresist is deposited preferably using conventional photoresist deposition techniques.

Figure 7:
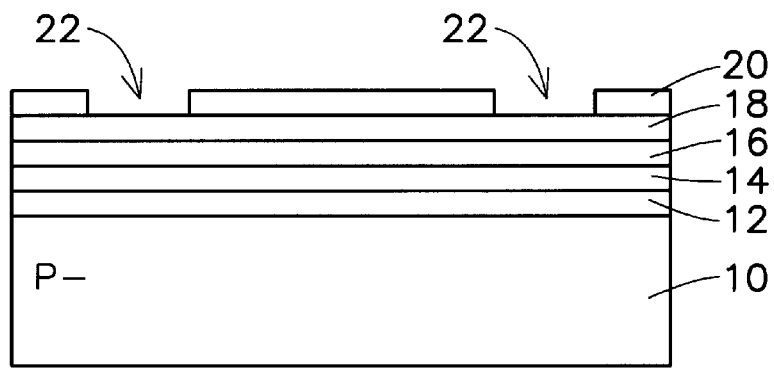

Referring to FIG. 7, the photoresist layer 20 is photolithographically exposed and developed to leave the patterned photoresist layer 20 as shown in FIG. 7 having openings 22 located in the photoresist layer 20.

Figure 8:
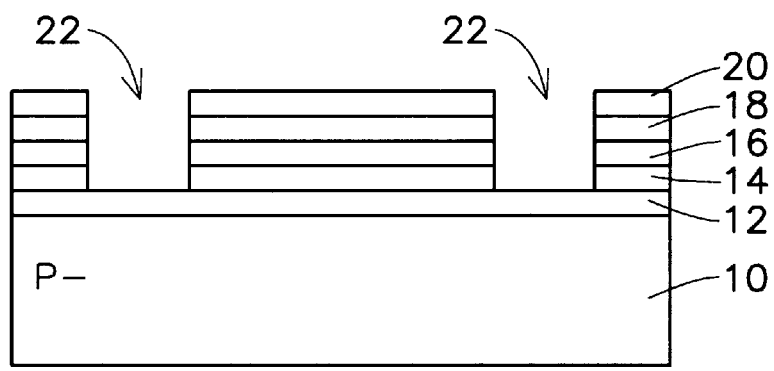

Referring to FIG. 8, the openings 22 in the photoresist layer 20 are shown as also formed as openings in the silicon nitride layer 18, the silicon dioxide layer 16 and the amorphous polysilicon layer 14. The portions of the silicon nitride layer 18 that are shown as removed or etched away in FIG. 8 is achieved by preferably using a silicon nitride etchant. The portions of the silicon dioxide layer 16 that are shown as removed or etched away in FIG. 8 is achieved by preferably using an etchant that removes silicon dioxide material. The portions of the amorphous polysilicon layer 14 that are shown as removed or etched away in FIG. 8 is achieved by preferably using an etchant that removes polysilicon material.

Figure 9:
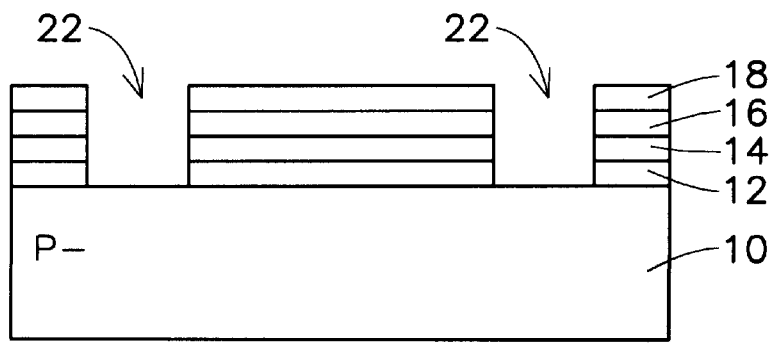
Figure 10:
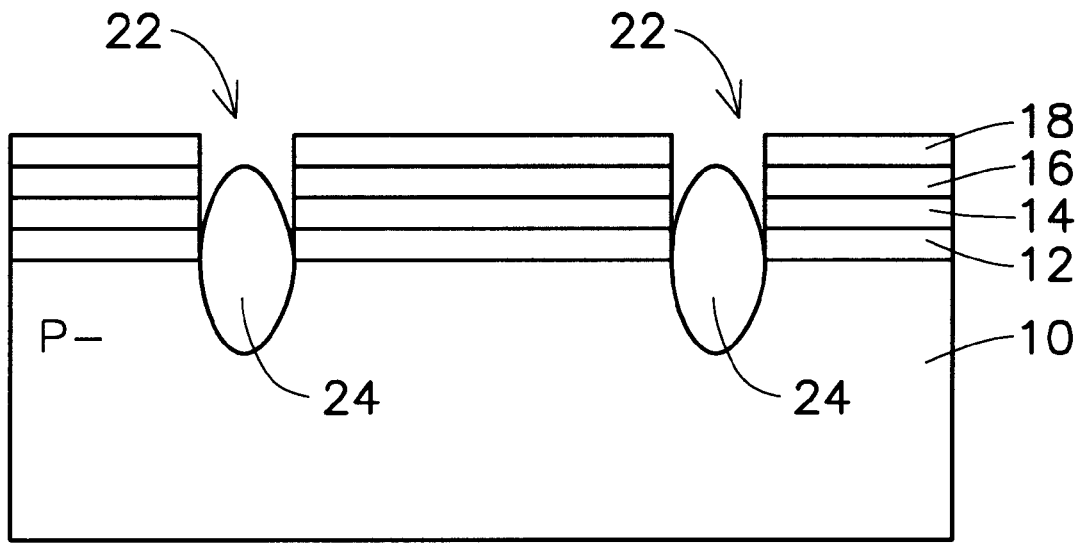

Referring to FIG. 9, the photoresist layer 20 (as shown in FIG. 8) is removed and then portions of the oxynitride layer 12 at the bottom of the openings 22 are removed preferably by an etchant that removes oxynitride material with the silicon nitride layer 18 functioning as a mask for the etchant removal of the oxynitride material. Following the etchant removal of the portions of the oxynitride layer 12 at the bottom of the openings 22, a thermal oxidation operation or process is carried out to form very narrow silicon dioxide (substantially vertically shaped) dielectric regions 24 which extend substantially vertically inwardly into the surface of the semiconductor substrate 10 and for a substantially vertical distance above the surface of the semiconductor substrate 10 in the openings 22 as shown in FIG. 10. Because of the thickness of the stress relief layer 12 that lies directly on the surface of the semiconductor substrate 10, lateral expansion or growth of the thermally grown silicon dioxide regions 24 in a direction beyond the openings 22 in the oxynitride layer 12 is inhibited which serves to restrict the growth or expansion of the thermally grown silicon dioxide regions 24 to a substantially vertical direction downwardly into the silicon semiconductor substrate 10 and to a substantially vertical direction upwardly above the surface of the silicon semiconductor substrate 10. The sealing interface oxynitride material layer 12 provides a lateral diffusion barrier to oxygen during the subsequent (see FIG. 10) field oxidation process while the amorphous polysilicon buffering layer 14 allows for the thinning of the stress relief oxynitride oxygen diffusion barrier layer 12. The stress relief properties of the poly-buffering (amorphous polysilicon) layer 14 also permits the subsequent formation of a thicker silicon nitride layer 18 which is used to protect the active semiconductor device regions during the field ($SiO_2$) oxidation process. Consequently, the thermal growth of the downwardly directed silicon dioxide regions 24 into the semiconductor substrate 10 is very narrow and therefore, permits greater density of dielectrically (sidewall) isolated semiconductor MOS and CMOS devices in each semiconductor chip. The undesired lateral expansion of the Silicon Dioxide sidewall isolation regions in prior art semiconductor devices is known in the semiconductor processing art as "Bird Beak" encroachment. Hence, the use of the thin oxynitride layer 12 in the process or method of the subject invention inhibits this undesired "Bird Beak" lateral expansion of the thermal Silicon Dioxide regions 24.

Figure 11:
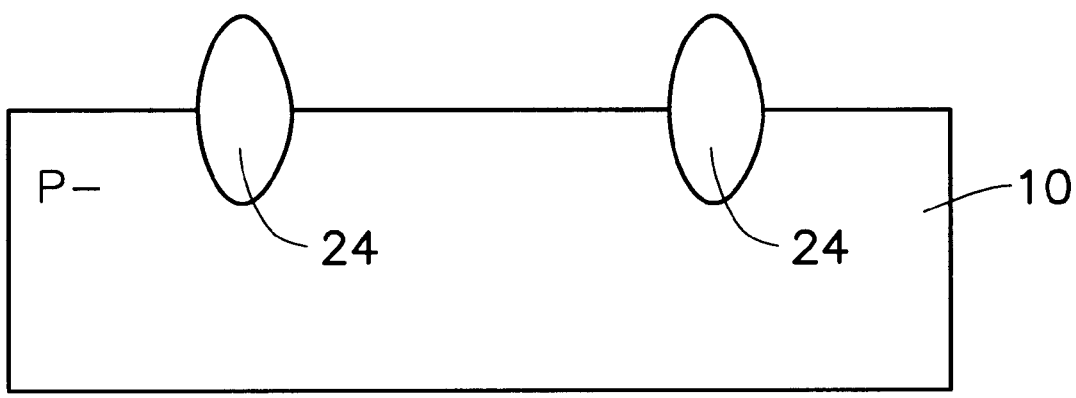

Referring to FIG. 11, the remaining portions of the silicon nitride layer 18 (which functions as an active definition or masking layer), the silicon dioxide layer 16 which functions as an oxide cap and also serves to avoid undesired pitting of the amorphous polysilicon layer 14 and to avoid undesired interaction between the silicon nitride layer 18 and the amorphous polysilicon layer 14 in regions or areas of high stress, the amorphous polysilicon layer 14 (which is a poly-buffer layer), and the oxide or oxynitride stress relief layer 12 and the layer that prevents the undesired lateral expansion of the thermally grown silicon dioxide (sidewall isolation) regions are all removed as shown in FIG. 8 thus leaving the silicon semiconductor substrate 10 with its thermally grown silicon dioxide regions 24.

Referring to FIGS. 12–15, one manner of forming MOS devices in the semiconductor substrate 10 and for forming both P channel and N channel MOS devices (CMOS or Complementary MOS devices) is shown. It should be understood that other methods or process steps can be employed other than that shown in FIGS. 12–15 to create various semiconductor devices such as MOS and CMOS devices that are sidewall dielectrically isolated.

Figure 12:
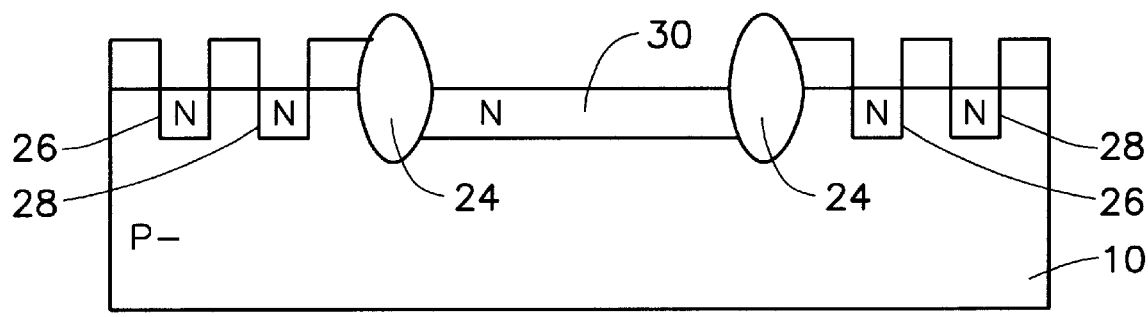

In FIG. 12, source and drain N type semiconductor regions 26 and 28, respectively, are formed in the P-semiconductor substrate 10 by using masking techniques and either diffusion or ion implantation techniques to insert an N or P type impurity into the semiconductor substrate 10 to create the source and drain regions 26 and 28. If desired, at an earlier time using a separate N diffusion or ion implantation process operation, an N type well region 30 is formed in the semiconductor substrate 10. The source and drain regions 26 and 28 can be N+ or P+ regions (if the substrate 10 is N type rather than P type), if desired whereas the N well region 30 can be an N or N− region.

Figure 13:
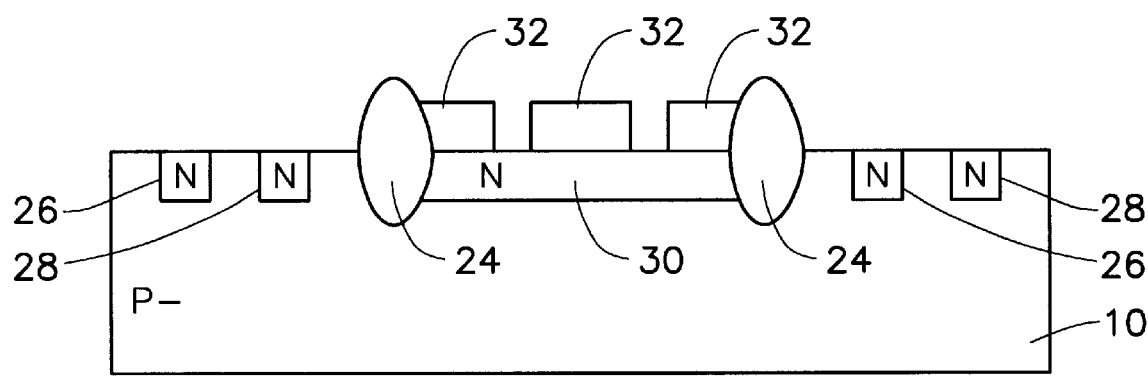

Referring to FIG. 13, a silicon dioxide layer 32 is formed or deposited on the semiconductor substrate 10 and then by using photolithographic and etching techniques, openings are formed in the silicon dioxide layer portion 32 that remains (after the etching operation) above the N type well 30.

Figure 14:
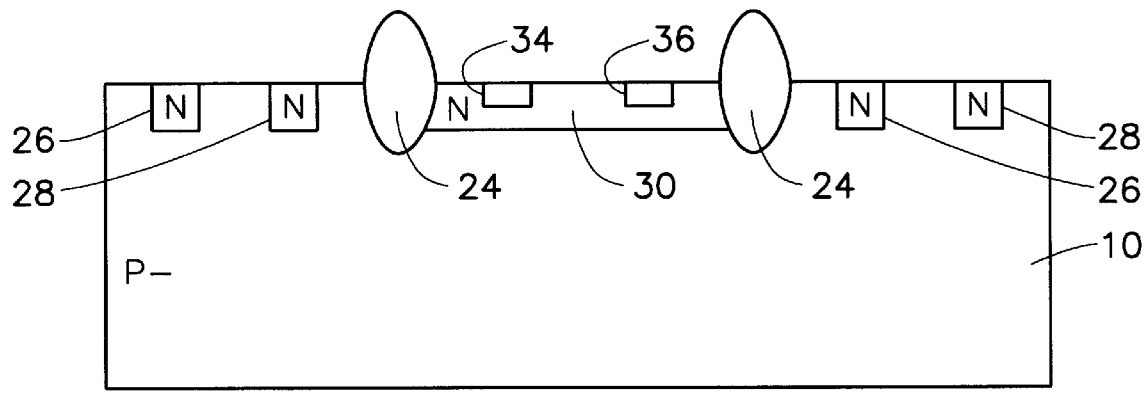

Referring to FIG. 14, these openings in the remaining portions of the silicon dioxide layer 32 and the oxide isolation regions are used for the formation of the preferably P+ and/or N+ (if the well is P type and the substrate is N type) source and drain regions 34 and 36 (the amount of impurities for the P or N doping to form the source and drain regions 34 and 36 can be varied, as desired).

Figure 15:
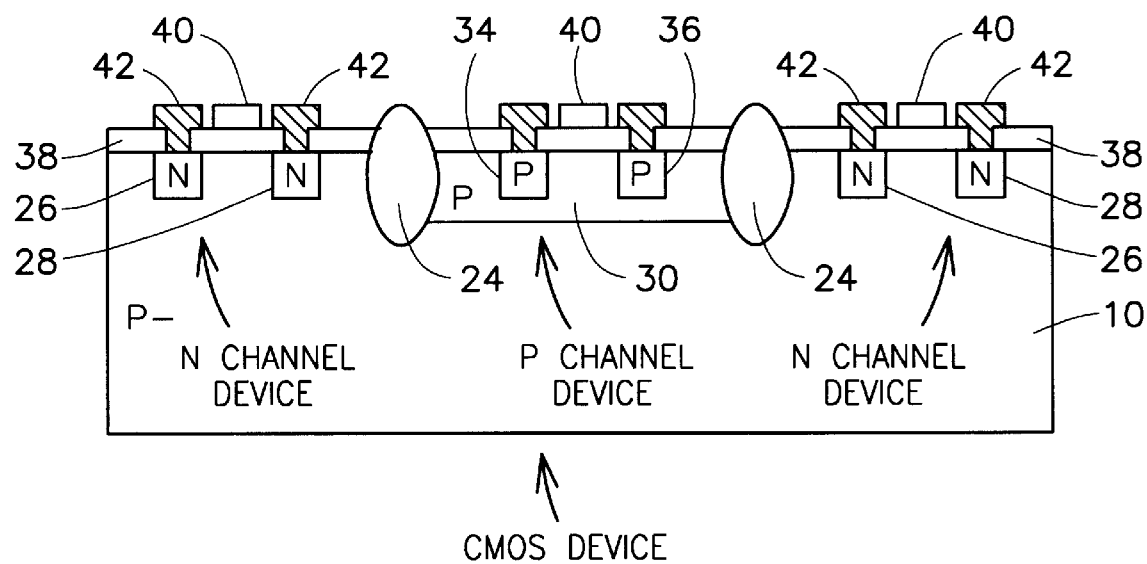

Referring to FIG. 15, this Figure depicts or illustrates the completed CMOS integrated semiconductor device with N channel MOS devices shown on opposite sides of a central (between the silicon dioxide side isolation regions 24) P channel MOS device (thereby forming a CMOS structure). Gate electrodes (such as doped polysilicon gate electrodes 40) are provided (on oxide regions 38) for the N channel and P channel MOS devices respectively. It should be understood that metal gate electrodes can be used, if desired. Preferably, Aluminum Silicon Copper electrodes are formed as electrical contacts 42 to the source and drain regions of the P and N channel MOS devices. If desired, other metal electrode contacts such as aluminum or aluminum silicon can be used instead of the Aluminum Silicon Copper electrodes 42.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A method of forming thermal silicon dioxide side isolation regions in a semiconductor substrate comprising the steps of:

providing a semiconductor substrate;

forming an oxynitride layer on a surface of said semiconductor substrate;

depositing an amorphous polysilicon layer on a surface of said oxynitride layer;

depositing a silicon dioxide layer on a surface of said amorphous polysilicon layer;

depositing a silicon nitride layer on a surface said silicon dioxide layer;

forming a patterned photoresist layer with openings therein on a surface of said silicon nitride layer;

removing portions of said silicon nitride layer, said silicon dioxide layer and said amorphous polysilicon layer beneath said openings in said patterned photoresist layer;

removing said patterned photoresist layer lying on said silicon nitride layer;

removing exposed portions of said oxynitride layer exposed after the step of removing portions of said silicon nitride layer, said silicon dioxide layer and said amorphous polysilicon layer using said silicon nitride layer as a mask;

thermally growing narrow silicon dioxide sidewall isolation regions into said semiconductor substrate through openings formed in said oxynitride layer;

removing remaining portions of said silicon nitride layer, said silicon dioxide layer, said amorphous polysilicon layer and said oxynitride layer located on said semiconductor substrate to leave said semiconductor substrate with a bare surface having said narrow silicon dioxide sidewall isolation regions located in surface portions of said semiconductor substrate; and subsequently forming MOS semiconductor devices in said semiconductor substrate between said narrow silicon dioxide sidewall isolation regions formed in said semiconductor substrate.

2. The method of claim 1 wherein the steps of forming said oxynitride layer comprising the step of growing said oxynitride layer using $N_2O$ as the oxidizing agent.

3. The method of claim 1 wherein the step of depositing said amorphous polysilicon layer comprising the step of depositing said amorphous polysilicon layer using a Chemical Vapor Deposition (CVD) process.

4. The method of claim 1 wherein the step of depositing said silicon dioxide layer comprising the step of depositing said silicon dioxide layer using a Chemical Vapor Deposition (CVD) process.

5. The method of claim 1 wherein the step of depositing said silicon nitride layer comprising the step of depositing said silicon nitride layer using a Chemical Vapor Deposition (CVD) process.

6. The method of claim 1 wherein the step of forming a patterned photoresist layer with openings therein comprising the step of depositing a photoresist layer on said silicon nitride layer, and photolithographically exposing and developing said photoresist layer to form said openings therein.

7. The method of claim 1 wherein the step of removing portions of said silicon nitride layer, said silicon dioxide layer and said amorphous polysilicon layer beneath said openings in said patterned photoresist layer comprising the step of etching away said portions of said silicon nitride layer, said silicon dioxide layer and said amorphous polysilicon layer.

8. The method of claim 1 wherein the step of removing exposed portions of said oxynitride layer after removing portions of said silicon nitride layer, said silicon dioxide layer and said amorphous polysilicon layer using said silicon nitride layer as a mask comprising the step of etching away said exposed portions of said oxynitride layer.

9. The method of claim 1 wherein the step of removing remaining portions of said silicon nitride layer, said silicon dioxide layer, said amorphous silicon layer and said oxynitride layer comprising the step of sequentially etching away said silicon nitride layer, said silicon dioxide layer, said amorphous silicon layer and said oxynitride layer.

10. The method of claim 1 wherein the step of subsequently forming MOS semiconductor devices in said semiconductor substrate between said narrow silicon dioxide sidewall isolation regions comprising the steps of forming source and drain regions of one type conductivity in said semiconductor substrate which is of opposite type conductivity, forming source and drain regions of said opposite type conductivity in a portion of said semiconductor substrate that is of said one type conductivity, and forming gate electrodes and source and drain contacts to provide side wall dielectrically isolated complementary MOS (CMOS) devices.

11. The method of claim 1 wherein the steps of forming said oxynitride layer comprising the step of growing said oxynitride layer using $N_2O$ as the oxidizing agent, the step of depositing said amorphous polysilicon layer comprising the step of depositing said amorphous polysilicon layer using a Chemical Vapor Deposition (CVD) process, the step of depositing said silicon dioxide layer comprising the step of depositing said silicon dioxide layer using a Chemical Vapor Deposition (CVD) process, the step of depositing said silicon nitride layer comprising the step of depositing said silicon nitride layer using a Chemical Vapor Deposition (CVD) process, the step of forming a patterned photoresist layer with openings therein comprising the step of depositing a photoresist layer on said silicon nitride layer, and photolithographically exposing and developing said photoresist layer to form said openings therein, the step of removing portions of said silicon nitride layer, said silicon dioxide layer and said amorphous polysilicon layer beneath said openings in said patterned photoresist layer comprising the step of etching away said portions of said silicon nitride layer, said silicon dioxide layer and said amorphous polysilicon layer, including the step of removing said patterned photoresist layer, including the step of removing exposed portions of said oxynitride layer using said silicon nitride layer as a mask, including the step of forming said isolation regions of thermally grown oxide using said silicon nitride, silicon dioxide, amorphous polysilicon, and oxynitride layers as the mask, the step of removing remaining portions of said silicon nitride layer, said silicon dioxide layer, said amorphous silicon layer and said oxynitride layer comprising the step of sequentially etching away said silicon nitride layer, said silicon dioxide layer, said amorphous silicon layer and said oxynitride layer, the step of subsequently forming MOS semiconductor devices in said semiconductor substrate between said narrow silicon dioxide sidewall isolation regions comprising the steps of forming source and drain regions of one type conductivity in said semiconductor substrate which is of opposite type conductivity, forming source and drain regions of said opposite type conductivity in a portion of said semiconductor substrate that is of said one type conductivity, and forming gate electrodes and source and drain contacts to provide side wall dielectrically isolated complementary MOS (CMOS) devices.

12. The method of claim 1, wherein said oxynitride layer performs a stress relief function for said semiconductor substrate.

* * * * *